(12) United States Patent
Lim et al.

(10) Patent No.: US 12,307,037 B2
(45) Date of Patent: May 20, 2025

(54) DISPLAY DEVICE

(71) Applicant: Samsung Display Co., LTD., Yongin-si (KR)

(72) Inventors: Jae Ik Lim, Yongin-si (KR); Seong Jun Lee, Yongin-si (KR); Jae Bum Cho, Yongin-si (KR); Hyungseok Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 44 days.

(21) Appl. No.: 18/342,899

(22) Filed: Jun. 28, 2023

(65) Prior Publication Data

US 2024/0069659 A1   Feb. 29, 2024

(30) Foreign Application Priority Data

Aug. 26, 2022  (KR) .................. 10-2022-0107782

(51) Int. Cl.
| | | |
|---|---|---|
| *G06F 3/041* | (2006.01) | |
| *H10K 59/122* | (2023.01) | |
| *H10K 59/40* | (2023.01) | |
| *G06F 3/044* | (2006.01) | |

(52) U.S. Cl.
CPC ......... *G06F 3/0412* (2013.01); *H10K 59/122* (2023.02); *H10K 59/40* (2023.02); *G06F 3/0446* (2019.05); *G06F 2203/04111* (2013.01); *G06F 2203/04112* (2013.01)

(58) Field of Classification Search
CPC .... G06F 3/0412; G06F 3/0446; G06F 3/0443; G06F 3/04164; G06F 3/042; G06F 3/013; G06F 2203/04112; G06F 2203/04103; G06F 2203/04109; G06F 2203/04111; G09G 2300/0412; G09G 3/3233
See application file for complete search history.

(56) References Cited

U.S. PATENT DOCUMENTS

| | | | |
|---|---|---|---|
| 10,734,452 B1 | 8/2020 | Kim et al. | |
| 2007/0176548 A1* | 8/2007 | Kim ...................... | H10K 50/841 313/512 |
| 2018/0198025 A1* | 7/2018 | Sim ...................... | H01L 21/0237 |

(Continued)

FOREIGN PATENT DOCUMENTS

| | | |
|---|---|---|
| KR | 10-2020-0127103 | 11/2020 |
| KR | 10-2021-0004006 | 1/2021 |

(Continued)

*Primary Examiner* — Dong Hui Liang
(74) *Attorney, Agent, or Firm* — KILE PARK REED & HOUTTEMAN PLLC

(57) ABSTRACT

A display device according to an embodiment includes a pixel electrode disposed on a substrate, a pixel defining layer disposed on the pixel electrode and including a pixel opening overlapping the pixel electrode, an encapsulation layer disposed on the pixel defining layer, a sensing electrode portion disposed on the encapsulation layer, a sensing insulating layer overlapping at least part of the sensing electrode portion, and an adhesive layer disposed on the sensing insulating layer. The sensing insulating layer includes a first region overlapping the sensing electrode portion, and a second region overlapping the pixel opening. A refractive index of the adhesive layer is less than a refractive index of the sensing insulating layer.

20 Claims, 16 Drawing Sheets

(56) References Cited

U.S. PATENT DOCUMENTS

| | | | | |
|---|---|---|---|---|
| 2019/0013495 A1* | 1/2019 | Kim | ................... | H10K 59/8792 |
| 2020/0161395 A1* | 5/2020 | Kim | ................... | H10K 59/879 |
| 2020/0227489 A1* | 7/2020 | Kim | ................... | H10K 50/856 |
| 2021/0126227 A1* | 4/2021 | Choi | ................... | H10K 59/879 |
| 2022/0190045 A1* | 6/2022 | Lee | ................... | G06F 3/04164 |

FOREIGN PATENT DOCUMENTS

| | | |
|---|---|---|
| KR | 10-2022-0004892 | 1/2022 |
| KR | 10-2022-0058720 | 5/2022 |

* cited by examiner

DISPLAY DEVICE

CROSS-REFERENCE TO RELATED APPLICATION(S)

This application claims priority to and benefits of Korean Patent Application No. 10-2022-0107782 under 35 U.S.C. § 119, filed in the Korean Intellectual Property Office on Aug. 26, 2022, the entire contents of which are incorporated herein by reference.

BACKGROUND

(a) Technical Field

The disclosure relates to a display device.

(b) Description of the Related Art

A display device displays images on a screen, and may include a liquid crystal display (LCD), or an organic light emitting diode (OLED) display. A display device may be used for various electronic devices such as a portable phone, a GPS, a digital camera, an electronic book, a portable game device, or various terminals.

A display device such as an organic light emitting device may be folded or bent by using a flexible substrate.

The above information disclosed in this Background section is only for enhancement of understanding of the background of the disclosure, and therefore this Background section may contain information that does not form the prior art that is already known in this country to a person of ordinary skill in the art.

SUMMARY

The disclosure has been made in an effort to provide a display device that is robust in a high temperature and high moisture condition, and in an effort to increase extracted light efficiency.

An embodiment of the disclosure provides a display device that may include a pixel electrode disposed on a substrate, a pixel defining layer disposed on the pixel electrode and including a pixel opening overlapping the pixel electrode, an encapsulation layer disposed on the pixel defining layer, a sensing electrode portion disposed on the encapsulation layer, a sensing insulating layer overlapping at least part of the sensing electrode portion, and an adhesive layer disposed on the sensing insulating layer. The sensing insulating layer may include a first region overlapping the sensing electrode portion and a second region overlapping the pixel opening. A refractive index of the adhesive layer may be less than a refractive index of the sensing insulating layer.

The display device may further include a first insulating layer disposed on the encapsulation layer, and a first sensing insulating layer disposed on the first insulating layer, the sensing insulating layer may be a second sensing insulating layer, and the sensing electrode portion may include a sensing electrode connector disposed between the first insulating layer and the first sensing insulating layer, and a sensing electrode disposed on the first sensing insulating layer.

The second sensing insulating layer may be disposed on the sensing electrode and the first sensing insulating layer, and the first region may overlap the sensing electrode. The first region may be disposed on the sensing electrode. A shape of the first region in a plan view may correspond to a shape of the sensing electrode in a plan view.

A thickness of the sensing electrode connector may be less than a thickness of the sensing electrode.

A width between ends of the second region may be greater than a width between ends of the opening.

The adhesive layer may physically contact part of the first sensing insulating layer.

The display device may further include a polarization layer disposed on the adhesive layer.

A refractive index of the second sensing insulating layer may be about 1.40 to about 1.59.

The first region may be spaced from the second region.

The second sensing insulating layer may further include at least one connector physically connecting the first region and the second region.

A width of the connector may be equal to or less than about one half of a width of the first region.

Another embodiment of the disclosure provides a display device that may include a pixel electrode disposed on a substrate, a pixel defining layer disposed on the pixel electrode and including a pixel opening overlapping the pixel electrode, an encapsulation layer disposed on the pixel defining layer, a sensing electrode disposed on the encapsulation layer, a first sensing insulating layer disposed on the sensing electrode, a sensing electrode connector disposed on the first sensing insulating layer, a second sensing insulating layer disposed on the first sensing insulating layer, and an adhesive layer disposed on the second sensing insulating layer. The second sensing insulating layer may overlap the pixel opening, and a refractive index of the adhesive layer may be less than a refractive index of the second sensing insulating layer.

The first sensing insulating layer may include an organic insulating material.

A width between ends of the second sensing insulating layer may be greater than a width between ends of the opening. The second sensing insulating layer may have an island shape.

The adhesive layer may overlap the first sensing insulating layer, the second sensing insulating layer, and an upper side of the sensing electrode connector.

A thickness of the sensing electrode connector may be less than a thickness of the sensing electrode.

The second sensing insulating layer may expose the sensing electrode connector.

A thickness of the second sensing insulating layer may be about 1.5 micrometers to about 3.5 micrometers.

A refractive index difference between the second sensing insulating layer and the adhesive layer may be equal to or greater than about 0.05.

The display device may further include a polarization layer disposed on the adhesive layer.

According to the embodiments, a display device that is robust under high temperature and high moisture conditions, and that increases the extracted light efficiency may be provided.

BRIEF DESCRIPTION OF THE DRAWINGS

FIG. 8, FIG. 9, FIG. 19, FIG. 11, and FIG. 12 are schematic top plan views of a second sensing insulating layer in a display device according to an embodiment.

DETAILED DESCRIPTION OF THE EMBODIMENTS

Figure 1:
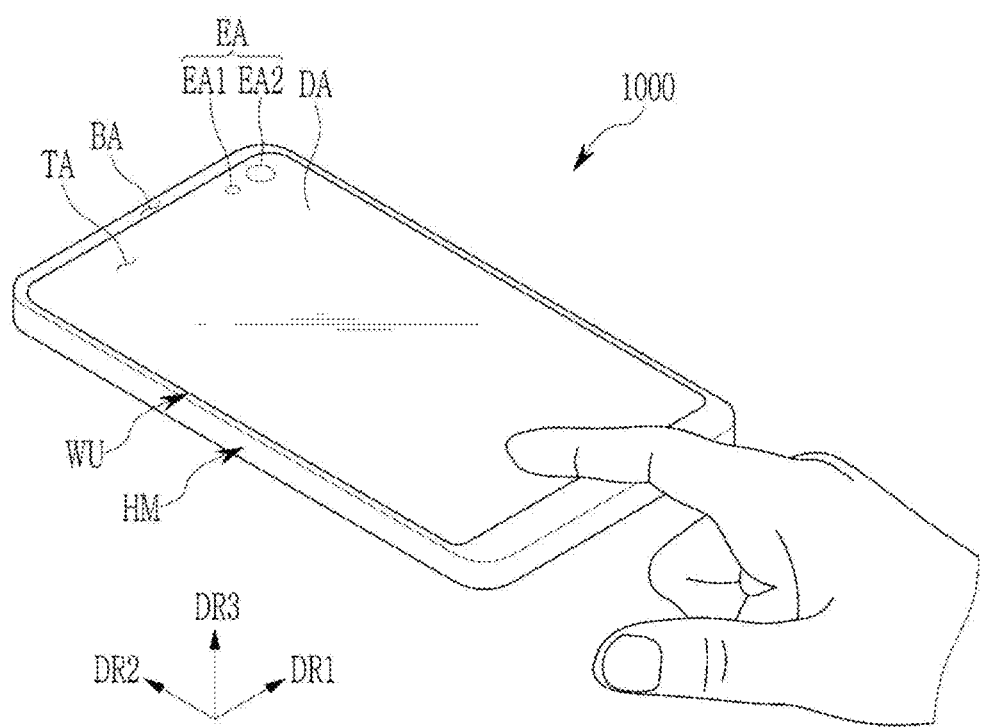
FIG. 1 is a schematic perspective view of a using state of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

The drawings and description are to be regarded as illustrative in nature and not restrictive, and like reference numerals designate like elements throughout the specification.

The size and thickness of each configuration shown in the drawings may be arbitrarily shown for better understanding and ease of description, but the disclosure is not limited thereto.

As used herein, the singular forms, "a," "an," and "the" are intended to include the plural forms as well, unless the context clearly indicates otherwise.

In the specification and the claims, the phrase "at least one of" is intended to include the meaning of "at least one selected from the group of" for the purpose of its meaning and interpretation. For example, "at least one of A and B" may be understood to mean any combination including "A, B, or A and B."

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

It will be understood that when an element such as a layer, film, region, or substrate is referred to as being "on" another element, it can be directly on the other element or intervening elements may also be present. In contrast, when an element is referred to as being "directly on" another element, there may be no intervening elements present. The word "on" or "above" means positioned on or below the object portion, and does not necessarily mean positioned on the upper side of the object portion based on a gravitational direction.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The terms "overlap" or "overlapped" or "overlapping" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About" or "approximately" or "substantially" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
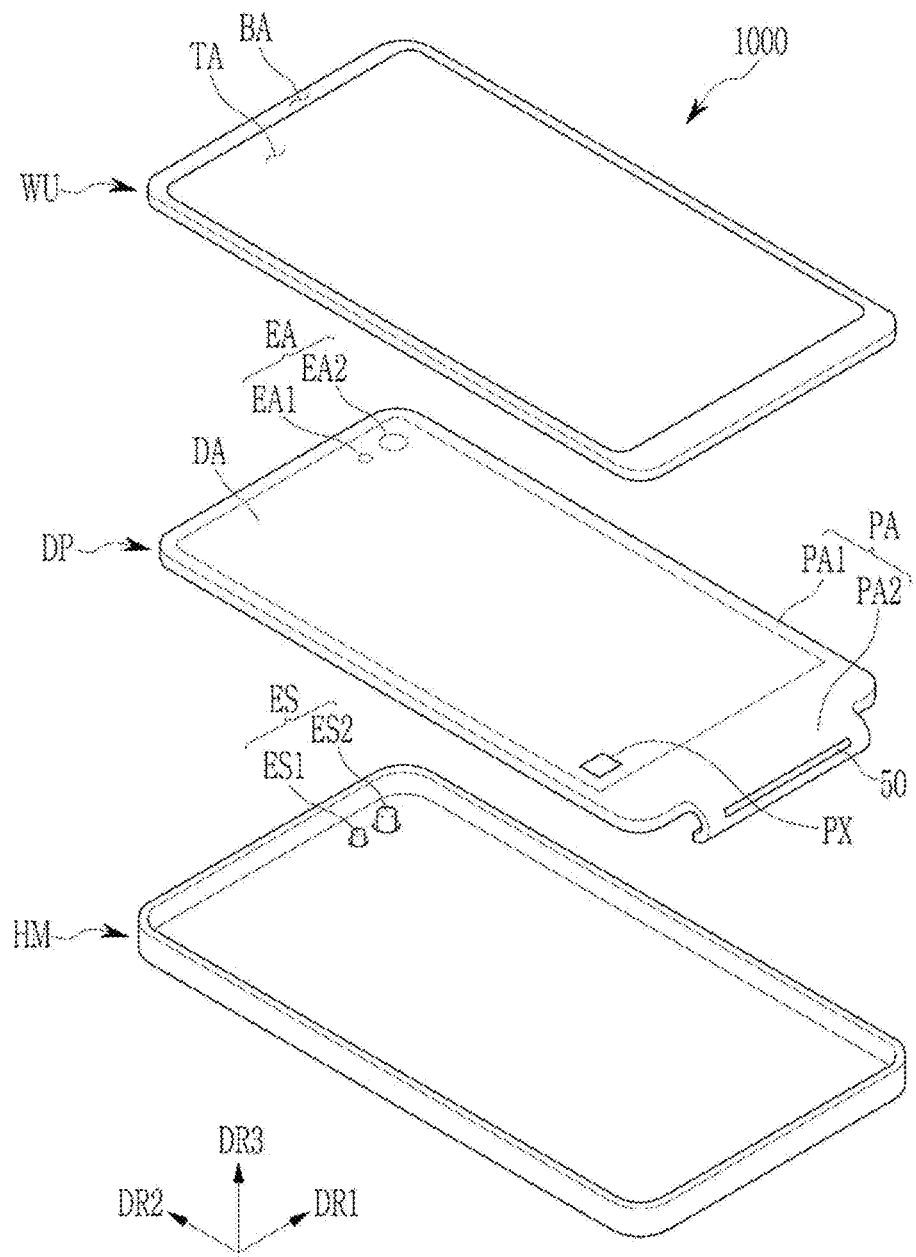
FIG. 2 is an exploded schematic perspective view of a display device according to an embodiment.
Figure 3:
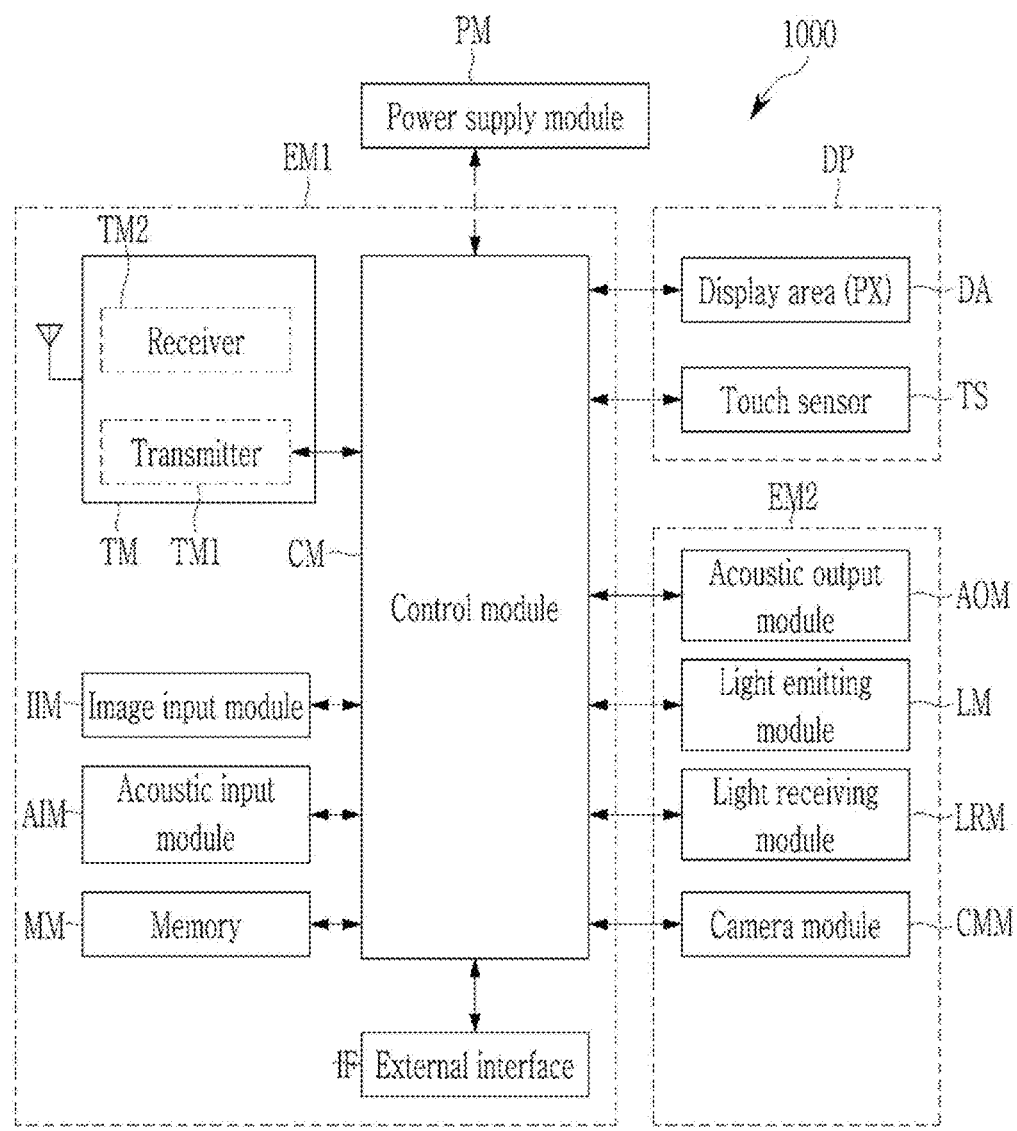
FIG. 3 is a schematic block diagram of a display device according to an embodiment.

A structure of a display device will now be described with reference to FIG. 1 to FIG. 3. FIG. 1 is a schematic perspective view of a using state of a display device according to an embodiment. FIG. 2 is an exploded schematic perspective view of a display device according to an embodiment. FIG. 3 is a schematic block diagram of a display device according to an embodiment.

Referring to FIG. 1, the display device 1000 represents a device for displaying videos or still images, and it may be used as a display screen for portable electronic devices such as mobile phones, smartphones, tablet personal computers (PCs), mobile communication terminals, electronic organizers, electronic books, portable multimedia players (PMP s), global positioning systems, or ultra mobile PCs (UMPCs), and also for various products such as televisions, laptops, monitors, advertisement boards, or internet of things (JOT) devices. The display device 1000 may also be used for wearable devices such as smart watches, watch phones, glasses-type displays, or head mounted displays (HMDs). The display device 1000 may be used as a dashboard of a vehicle, a center information display (CID) disposed on a center fascia or a dashboard of a vehicle, a room mirror display replacing a side-view mirror of a vehicle, and a display disposed on a rear side of a front seat for entertainment for a back seat of a vehicle. FIG. 1 shows that the display device 1000 is used as a smartphone, for better comprehension and ease of description.

The display device 1000 may display images in a third direction DR3 to a displaying side parallel to a first direction DR1 and a second direction DR2. A displaying side on which images are displayed may correspond to a front surface of the display device 1000, and may correspond to a front surface of a cover window WU. The images may include videos and still images.

In an embodiment, front surfaces (upper sides) and bottom surfaces (lower sides) of respective members may be defined with respect to the image displaying direction. The front surface and the bottom surface may oppose each other in the third direction DR3, and normal directions of the respective front surface and the bottom surface may be parallel to the third direction DR3. A spaced distance between the front surface and the bottom surface in the third direction DR3 may correspond to the thickness of the display panel in the third direction DR3.

The display device 1000 may sense an input (refer to a hand of FIG. 1) of a user applied from an outside. The user input may include various types of external inputs such as some of a human body of the user, light, heat, and/or pressure. The user input is shown to be a hand of the user applied to the front surface. The disclosure is not limited thereto. The user input may be provided in various forms, and the display device 1000 may sense the user input applied to the lateral side or the bottom surface of the display device 1000 according to the structure of the display device 1000.

Referring to FIG. 1 and FIG. 2, the display device 1000 may include a cover window WU, a housing HM, a display panel DP, and an optical element ES. The cover window WU may be combined to the housing HM to configure an exterior of the display device 1000.

The cover window WU may include an insulation panel. For example, the cover window WU may be made of glass, plastic, and/or a combination thereof.

The front surface of the cover window WU may define the front surface of the display device 1000. The transmission area TA may be an optically transparent region. For example, the transmission area TA may have visible ray transmittance of equal to or greater than about 90%.

The blocking area BA may define a shape of the transmission area TA. The blocking area BA may be disposed near the transmission area TA and may surround the transmission area TA. The blocking area BA may have relatively lower light transmittance than the transmission area TA. The blocking area BA may include an opaque material for blocking light. The blocking area BA may have a predetermined or selected color. The blocking area BA may be defined by a bezel layer provided in addition to a transparent substrate for defining the transmission area TA, or may be defined by an ink layer inserted into or colored to the transparent substrate.

The display panel DP may include a display pixel PX for displaying images and a driver 50, and the display pixel PX may be positioned in the display area DA and the component area EA. The display panel DP may include a front surface including the display area DA and a non-display area PA. The display area DA and the component area EA may include pixels and display images, and they may sense inputs from the outside as a touch sensor is positioned on their upper sides in a third direction DR3 of the pixels.

The transmission area TA of the cover window WU may at least partly overlap the display area DA and the component area EA of the display panel DP. For example, the transmission area TA may overlap the entire side of the display area DA and the component area EA or may overlap at least part of the display area DA and the component area EA. Hence, the user may see the images through the transmission area TA or may provide external inputs based on the images. However, the disclosure is not limited thereto. For example, the region in which images are displayed may be separated from the region from which external inputs are sensed.

The non-display area PA of the display panel DP may at least partly overlap the blocking area BA of the cover window WU. The non-display area PA may be covered (overlapped) by the blocking area BA. The non-display area PA may be disposed near the display area DA, and may surround the display area DA. The non-display area PA may not display images, and a driving circuit for driving the display area DA or driving wires may be disposed therein. The non-display area PA may include a first peripheral area PA1 positioned on an outside of the display area DA, and a second peripheral area PA2 including a driver 50, a connection wire, and/or a bending region. In an embodiment described with reference to FIG. 2, the first peripheral area PA1 may be positioned on a side of the display area DA, and the second peripheral area PA2 may be positioned on another side of the display area DA.

The display panel DP may be assembled in a flat state so that the display area DA, the component area EA, and the non-display area PA may face the cover window WU. However, the disclosure is not limited thereto. A predetermined or selected portion of the non-display area PA of the display panel DP may be bent. Part of the non-display area PA may face the bottom surface of the display device 1000 so the blocking area BA seen on the front surface of the display device 1000 may be reduced, and in FIG. 2, the second peripheral area PA2 may be bent to be positioned on the bottom surface of the display area DA and be assembled.

The component area EA of the display panel DP may include a first component area EA1 and a second component area EA2. The first component area EA1 and the second component area EA2 may be at least partly surrounded by the display area DA. The first component area EA1 and the second component area EA2 are shown to be spaced from each other, and without being limited thereto, at least some thereof may be connected to each other. The first component area EA1 and the second component area EA2 may represent regions below which optical elements (refer to ES of FIG. 2; components hereinafter) using infrared rays, visible rays, and/or sound are arranged.

The display area (DA; referred to as a main display area) and the component area EA may include light emitting diodes and pixel circuits for generating light emitting currents and transmitting the same to the light emitting diodes. Here, one light emitting diode and one pixel circuit may configure a pixel PX. One pixel circuit and one light emitting diode may be formed one on one in the display area DA and the component area EA.

The first component area EA1 may include a transmission unit through which light and/or sound transmit and a display unit including pixels. The transmission unit may be positioned between adjacent pixels and may be configured with a transparent layer through which light and/or sound transmit. The transmission unit may be positioned between the adjacent pixels, and depending on embodiments, a layer through which no light transmits such as a light blocking member may overlap the first component area EA1. The number of pixels per area (also referred to as resolution) of the pixels (also referred to as normal pixels) included in the display area DA may be equal to the number of pixels per area included in the first component area EA1 (also referred to as first component pixels).

The second component area EA2 may include a region (also referred to as a light transmission area) configured to be a transparent layer so that light may transmit through. The light transmission area may include no conductive layer or semiconductor layer but may include an opening overlapping the position where the layer including a light blocking material, for example, a pixel defining layer and/or a light blocking member corresponds to the second component area EA2. The number of pixels per area of the pixels included in the second component area EA2 (also referred to as a second component pixel) may be less than the number of pixels per area of the normal pixels included in the display area DA. As a result, the resolution of the second component pixel may be lower than the resolution of the normal pixel.

Referring to FIG. 3, the display panel DP may further include a touch sensor TS in addition to the display area DA including the display pixels PX. The display panel DP may include pixels PX for generating images, and it may be visible to users from the outside through the transmission area TA. The touch sensor TS may be positioned on an upper portion of the pixels PX, and may sense external inputs applied from the outside. The touch sensor TS may sense external inputs provided to the cover window WU.

Referring to FIG. 2, the second peripheral area PA2 may include a bending portion. The display area DA and the first peripheral area PA1 may have a planar shape that is substantially parallel to a plane defined by the first direction DR1 and the second direction DR2, and a side of the second peripheral area PA2 may extend from the planar shape, may pass through the bending portion, and may again have a planar shape. As a result, at least part of the second peripheral area PA2 may be bent and may be assembled to be positioned on the rear side of the display area DA. In case assembled, the at least part of the second peripheral area PA2 may overlap the display area DA in a plan view, thereby reducing the blocking area BA of the display device 1000. However, the disclosure is not limited thereto. For example, the second peripheral area PA2 may not be bent.

The driver 50 may be installed in the second peripheral area PA2, and may be positioned on the bending portion or a respective side of the bending portion. The driver 50 may be provided in a chip form.

The driver 50 may be electrically connected to the display area DA and the component area EA and may transmit electrical signals to the pixels of the display area DA and the component area EA. For example, the driver 50 may provide data signals to the pixels PX disposed in the display area DA. In another way, the driver 50 may include a touch driving circuit, and may be electrically connected to the touch sensor TS disposed in the display area DA and/or the component area EA. The driver 50 may be designed to include various types of circuits in addition to the above-described circuits or provide various electrical signals to the display area DA.

A pad portion may be positioned at an end of the second peripheral area PA2, and the display device 1000 may be electrically connected to a flexible printed circuit board (FPCB) including a driving chip by the pad portion. The driving chip positioned on the flexible printed circuit board may include various types of driving circuits for driving the display device 1000 or a connector for supplying a power voltage. Depending on embodiments, instead of the flexible printed circuit board, a rigid printed circuit board (PCB) may be used.

The optical element ES may be disposed on a lower portion of the display panel DP. The optical element ES may include a first optical element ES1 overlapping the first component area EA1 and a second optical element ES2 overlapping the second component area EA2. The first optical element ES1 may use infrared rays, and in this instance, regarding the first component area EA1, a layer through which no light transmits such as the light blocking member may overlap the first component area EA1.

The first optical element ES1 may be an electronic component using light or sound. For example, the first optical element ES1 may be a sensor such as an infrared sensor for receiving light and using it, a sensor for outputting and sensing light or sound to measure distances or recognize fingerprints, a small lamp for outputting light, and/or a speaker for outputting sound. The electronic element using light may use various wavelengths of light such as visible light, infrared rays, and ultraviolet rays.

The second optical element ES2 may be at least one of a camera, an infrared (IR) camera, a dot projector, an IR illuminator, and a time-of-flight (ToF) sensor.

Referring to FIG. 3, the display device 1000 may include a display panel DP, a power supply module PM, a first electronic module EM1, and a second electronic module EM2. The display panel DP, the power supply module PM, the first electronic module EM1, and the second electronic module EM2 may be electrically connected to each other. FIG. 3 discloses an example of a display pixel and a touch sensor TS positioned in the display area DA from among the configuration of the display panel DP.

The power supply module PM may supply a power voltage for a general operation of the display device 1000. The power supply module PM may include a battery module.

The first electronic module EM1 and the second electronic module EM2 may include various types of functional modules for operating the display device 1000. The first electronic module EM1 may be mounted on a motherboard electrically connected to the display panel DP, or may be mounted on and additional substrate and may be electrically connected to the motherboard through a connector (not shown).

The first electronic module EM1 may include a control module CM, a radio communication module TM, an image input module IIM, an acoustic input module AIM, a memory MM, and an external interface IF. Some of the modules may not be mounted on the motherboard, and may be electrically connected to the motherboard through a flexible printed circuit board connected thereto.

The control module CM may control the general operation of the display device 1000. The control module CM may be a microprocessor. For example, the control module CM may activate/deactivate the display panel DP. The control module CM may control the other modules such as the image input module IIM or the acoustic input module AIM based on the touch signal received from the display panel DP.

The radio communication module TM may transmit/receive radio signals to/from other terminals by using Bluetooth or Wi-Fi lines. The radio communication module TM may transmit/receive voice signals by using a general communication line. The radio communication module TM may include a transmitter TM1 for modulating signals and transmitting the signals, and a receiver TM2 for demodulating the received signals.

The image input module IIM may process image signals and may convert the same into image data displayable on the display panel DP. The acoustic input module AIM may receive external acoustic signals by the microphone in a recording mode or a voice recognition mode, and may convert the same into electrical voice data.

The external interface IF may function as an interface connected to an external charger, a cord/cordless data port, or a card socket (e.g., a memory card or a SIM/UIM card).

The second electronic module EM2 may include an acoustic output module AOM, a light emitting module LM, a light receiving module LRM, and a camera module CMM, and at least some thereof may be positioned as optical elements ES on the bottom surface of the display area DA as shown in FIG. 1 and FIG. 2. The optical element ES may include a light emitting module LM, a light receiving module LRM, and a camera module CMM. The second electronic module EM2 may be mounted on the motherboard, may be mounted on an additional substrate and be electrically connected to the display panel DP through a connector (not shown), or may be electrically connected to the first electronic module EM1.

The acoustic output module AOM may convert the acoustic data received from the radio communication module TM or the acoustic data stored in the memory MM and may output the converted signals.

The light emitting module LM may generate light and may output the light. The light emitting module LM may output infrared rays. For example, the light emitting module LM may include an LED element. For example, the light receiving module LRM may sense the infrared rays. The light receiving module LRM may be activated in case that the infrared rays with equal to or greater than a predetermined or selected level are sensed. The light receiving module LRM may include a CMOS sensor. In case that the infrared rays generated by the light emitting module LM are output, they may be reflected on an external subject (e.g., a finger or a face of the user), and the reflected infrared rays may be input to the light receiving module LRM. The camera module CMM may photograph external images.

The optical element ES may additionally include a photosensor or a thermal sensor. The optical element ES may sense the external subject received through the front surface or may provide sound signals such as a voice to the outside through the front surface. The optical element ES may include multiple elements, and is not limited to one embodiment.

Referring to FIG. 2, the housing HM may be combined to the cover window WU. The cover window WU may be disposed on the front surface of the housing HM. The housing HM may be combined to the cover window WU and may provide a predetermined or selected receiving space. The display panel DP and the optical element ES may be received in a predetermined or selected receiving space provided between the housing HM and the cover window WU.

The housing HM may include a material with relatively great rigidity. For example, the housing HM may include glass, plastic, or metal, or may include multiple frames and/or plates configured with a combination thereof. The housing HM may stably protect the elements of the display device 1000 received in an internal space from external impacts.

Figure 4:
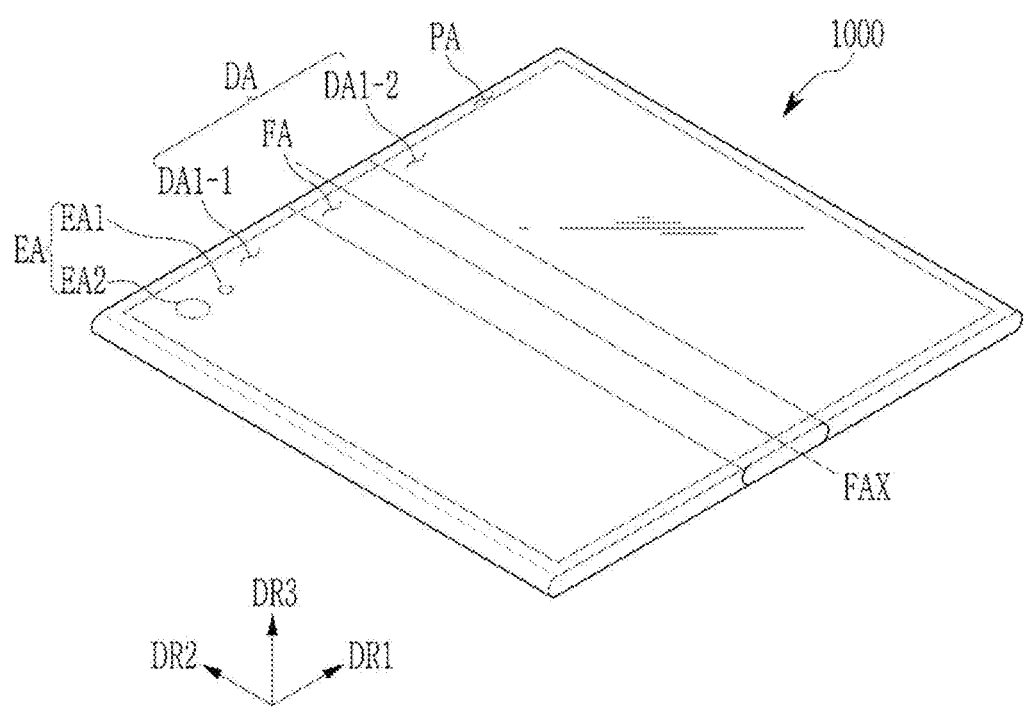
FIG. 4 is a schematic perspective view of a display device according to another embodiment.

A structure of the display device 1000 according to another embodiment will now be described with reference to FIG. 4. FIG. 4 is a schematic perspective view of a light emitting display device according to another embodiment. Descriptions of the same or similar elements as the above-noted elements will not be provided. FIG. 4 shows a foldable display device 1000 folded with respect to a folding axis FAX.

Referring to FIG. 4, the display device 1000 may be a foldable display device according to an embodiment. The display device 1000 may be folded to the inside or the outside with respect to the folding axis FAX. In case that the light emitting display device 1000 is folded to the outside with respect to the folding axis FAX, the displaying side of the light emitting display device 1000 may be positioned on the outside in the third direction DR3, and the images may be displayed in the respective directions. In case that the light emitting display device 1000 is folded to the inside with respect to the folding axis FAX, the displaying side may not be seen from the outside.

The display device 1000 may include a display area DA, a component area EA, and a non-display area PA. The display area DA may be divided into a first-1 display area DA1-1, a first-2 display area DA1-2, and a folding area FA. The first-1 display area DA1-1 and the first-2 display area DA1-2 may be positioned on the left and the right with respect to the folding axis FAX, and the folding area FA may be positioned between the first-1 display area DA1-1 and the first-2 display area DA1-2. In this instance, in case folded to the outside with respect to the folding axis FAX, the first-1 display area DA1-1 and the first-2 display area DA1-2 may be positioned on respective sides in the third direction DR3 and may display the images in the respective directions. In case folded to the inside with respect to the folding axis FAX, the first-1 display area DA1-1 and the first-2 display area DA1-2 may not be seen from the outside.

Figure 5:
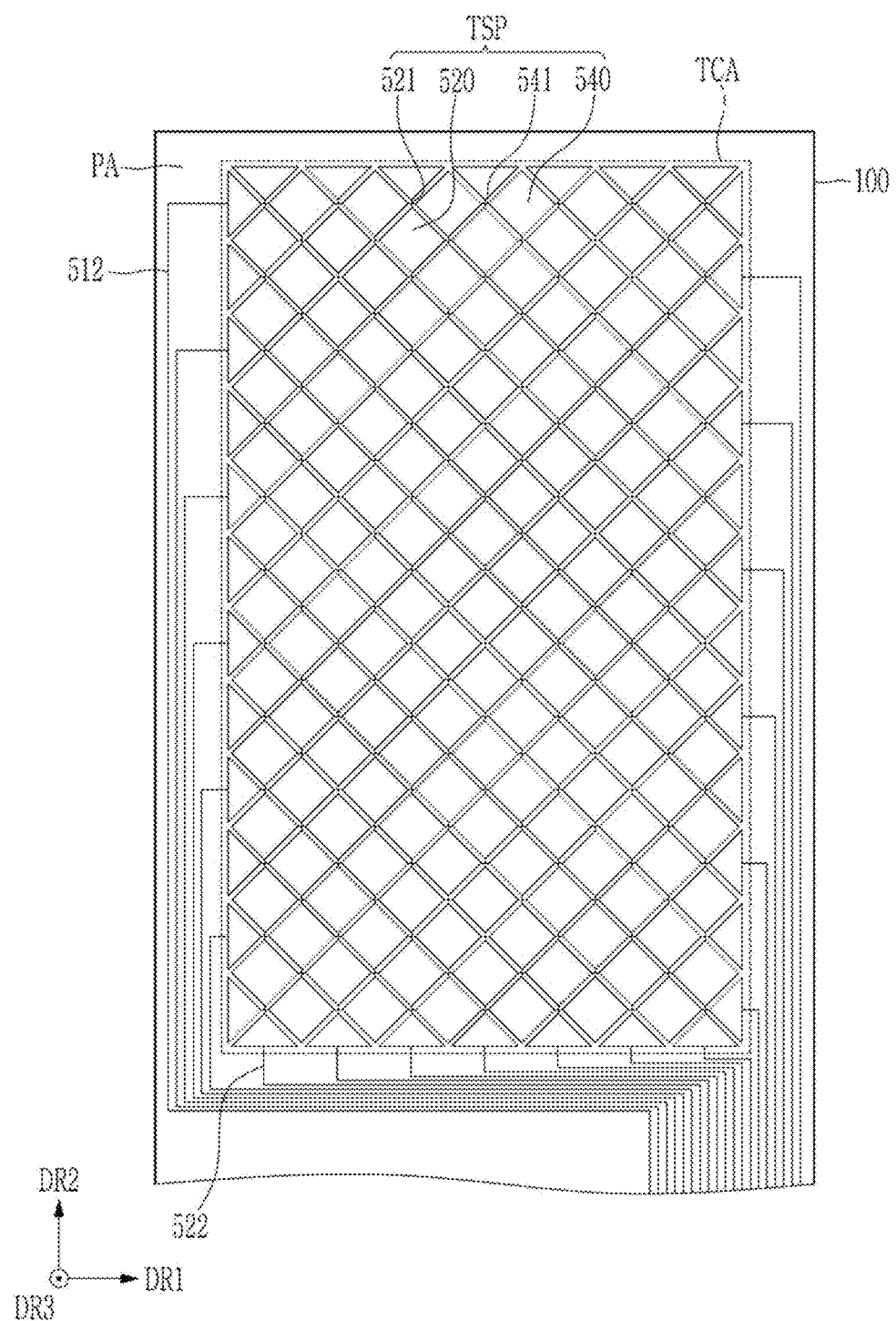
FIG. 5 is a schematic top plan view of a sensing electrode in a display panel according to an embodiment.

A sensing electrode portion included in the display panel will now be described with reference to FIG. 5. FIG. 5 is a schematic top plan view of a sensing electrode portion in a display panel according to an embodiment.

Referring to FIG. 5, a sensing area TCA including multiple sensing electrodes 520 and 540 may be positioned on an upper portion of the display area DA and an upper portion of the light emitting diode so as to recognize touches. A touch sensor TS may be positioned in the sensing area TCA.

Multiple sensing wires 512 and 522 may be further positioned in the non-display area PA. The sensing wires 512 and 522 may be connected to the sensing electrodes 520 and 540, and may be connected to part of the pad portion.

A touch sensor TSP according to an embodiment may include multiple sensing electrodes 520 and 540 and sensing electrode connectors 521 and 541. The sensing electrodes 520 and 540 may include multiple first sensing electrodes 520 and multiple second sensing electrodes 540 electrically separated from each other.

The first sensing electrodes 520 may be sensing input electrodes, and the second sensing electrodes 540 may be sensing output electrodes. This is, however, not limited, and the first sensing electrodes 520 may be the sensing output electrodes, and the second sensing electrodes 540 may be the sensing input electrodes.

The first sensing electrodes 520 and the second sensing electrodes 540 may be distributed and may be disposed in a mesh form so that they may not overlap each other in the sensing area TCA. The first sensing electrodes 520 may be arranged in one of a column direction and a row direction (or the second direction DR2, refer to FIG. 5), and the first sensing electrodes 520 may be electrically connected to each other by the first sensing electrode connector 521 (also referred to as a bridge). The second sensing electrodes 540 may be arranged in another one of the column direction and the row direction (or the first direction DR1, refer to FIG. 5), and the second sensing electrodes 540 may be electrically connected to each other by the second sensing electrode connectors 541.

The first sensing electrodes 520 and the second sensing electrodes 540 may be positioned on the same conductive layer. The first sensing electrodes 520 and the second sensing electrodes 540 may be positioned on different conductive layers, depending on embodiments. Referring to FIG. 5, the first sensing electrode 520 and the second sensing electrode 540 may have a rhombus shape, and without being limited thereto, they may have polygonal shapes such as a quadrangle or a hexagon, or a circle or an oval, depending on embodiments.

Referring to FIG. 5, the first sensing electrodes 520 and the second sensing electrodes 540 may be integrally formed to have the rhombus shape, but in actuality, one rhombus structure may have an opening, and may have a structure in which a linear structure is arranged in a mesh form. In this instance, the opening may correspond to the region in which the light emitting diode emits light upward. Also, depending on embodiments, it may further include a protrusion so as to improve sensitivity of a sensor.

The first sensing electrodes 520 and the second sensing electrodes 540 may be made of a transparent conductor or an opaque conductor. For example, the first sensing electrodes 520 and the second sensing electrodes 540 may include a transparent conductive oxide (TCO), and the transparent conductive oxide (TCO) may include at least one of an indium-tin oxide (ITO), an indium-zinc oxide (IZO), a zinc oxide (ZnO), carbon nanotubes (CNT), and graphene. The first sensing electrodes 520 and the second sensing electrodes 540 may also include multiple openings. The openings formed in the sensing electrodes 520 and 540 may allow light emitted by the light emitting diode to be discharged to the front without interference.

In case that the first sensing electrodes 520 and the second sensing electrodes 540 are positioned on the same layer, one of the first sensing electrode connector 521 and the second sensing electrode connector 541 may be positioned on the same layer as the first sensing electrode 520 and the second sensing electrode 540, and the other thereof may be positioned on a different layer from the first sensing electrode 520 and the second sensing electrode 540. As a result, the first sensing electrodes 520 may be electrically separated from the second sensing electrodes 540. The sensing electrode connector positioned on the different layer may be positioned on an upper layer or a lower layer of the first sensing electrode 520 and the second sensing electrode 540.

Multiple sensing wires 512 and 522 connected to the first sensing electrodes 520 and the second sensing electrodes 540 may be positioned in the non-display area PA. The first sensing wires 512 may be connected to the second sensing electrodes 540 disposed in the first direction DR1, and the second sensing wires 522 may be connected to the first sensing electrodes 520 disposed in the second direction DR2.

FIG. 5 shows a mutual-cap type of sensor for sensing touches by using two sensing electrodes 520 and 540. However, depending on embodiments, a self-cap type of sensor for sensing touches by using one sensing electrode may be formed.

Figure 6:
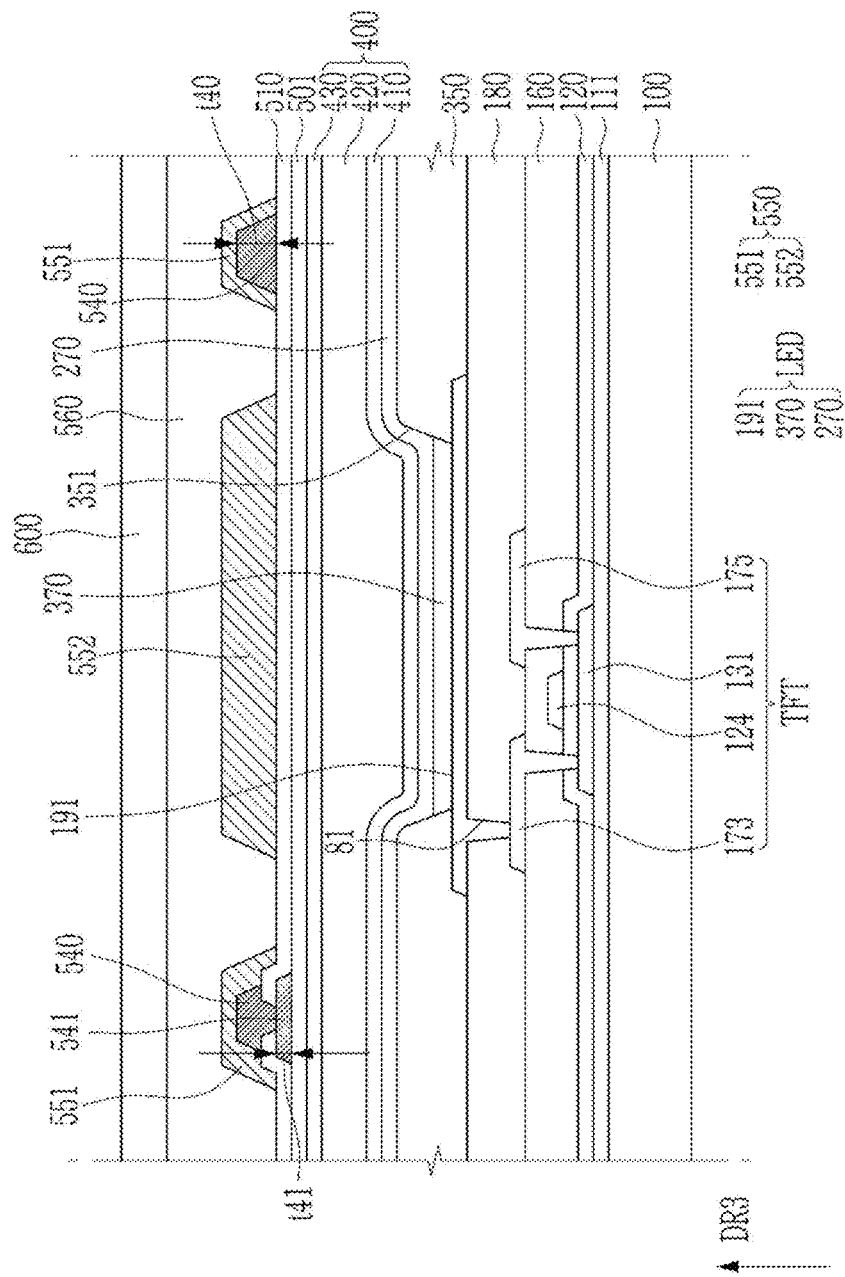
FIG. 6 is a schematic cross-sectional view of a portion of a display area in a display device according to an embodiment.
Figure 7:
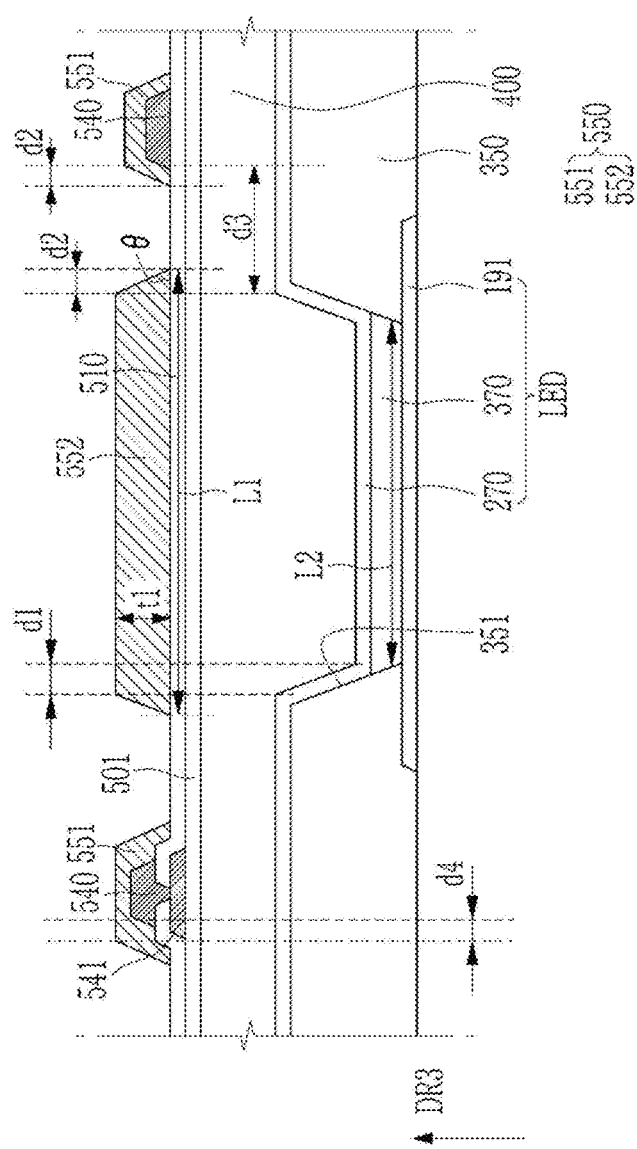
FIG. 7 is a schematic cross-sectional view of part of a display area in a display device according to an embodiment.
Figure 8:
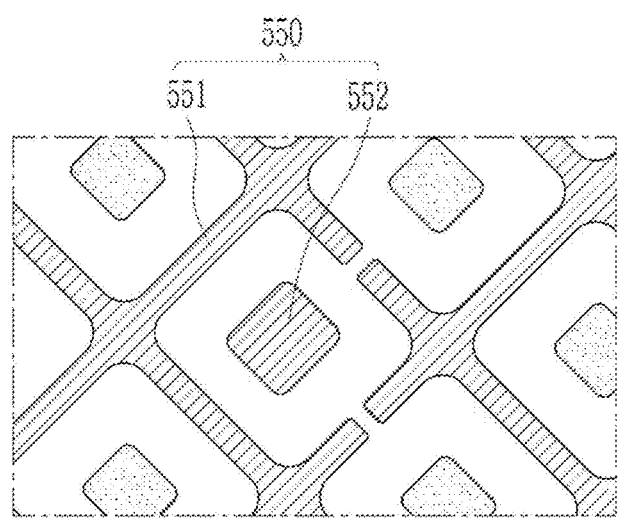

A display device according to an embodiment focusing on a cross-sectional diagram of a display area DA will now be described with reference to FIG. 6 to FIG. 8. FIG. 6 is a schematic cross-sectional view of a portion of a display area in a display device according to an embodiment. FIG. 7 is a schematic cross-sectional view of part of a display area in a display device according to an embodiment. FIG. 8 is a schematic top plan view of a second sensing insulating layer in a display device according to an embodiment.

The display device may include a substrate 100, and a transistor TFT positioned on the substrate 100 and including a semiconductor 131, a gate electrode 124, a source electrode 173, and a drain electrode 175.

In detail, a buffer layer 111 may be positioned on the substrate 100, a semiconductor 131 may be positioned on the buffer layer 111, a gate insulating layer 120 may be positioned on the semiconductor 131, and a gate electrode 124 may be positioned on the gate insulating layer 120. An interlayer insulating layer 160 may be positioned on the gate electrode 124, a source electrode 173 and a drain electrode 175 may be positioned on the interlayer insulating layer 160, and an organic film 180 may be positioned thereon.

The source electrode 173 and the drain electrode 175 may be respectively connected to part (a source region and a drain region) of the semiconductor 131 through the openings positioned in the gate insulating layer 120 and the interlayer insulating layer 160. A pixel electrode 191 may be positioned on the organic film 180, and a pixel defining layer 350 including a pixel opening 351 overlapping at least part of the pixel electrode 191 may be positioned on the pixel electrode 191. An emission layer 370 may be positioned in the pixel opening 351 of the pixel defining layer 350 and on the pixel electrode 191. A common electrode 270 may be positioned on the pixel defining layer 350 and the emission layer 370, and an encapsulation layer 400 may be positioned on the common electrode 270. Here, the pixel electrode 191, the emission layer 370, and the common electrode 270 may configure the light emitting diode (LED).

A first sensing insulating layer 510, a second sensing insulating layer 550, sensing electrodes 520 and 540, and sensing electrode connectors 521 and 541 may be included on the encapsulation layer 400 so as to sense touches.

A cross-sectional structure of FIG. 6 will now be described in detail.

The substrate 100 may include a rigid material such as glass or a flexible material such as plastic or polyimide.

A buffer layer 111 for smoothing the surface of the substrate 100 and blocking permeation of impure elements may be further positioned on the substrate 100. The buffer layer 111 may include an inorganic material, for example it may include an inorganic insulating material such as a silicon nitride (SiNx), a silicon oxide (SiOx), or a silicon oxynitride (SiOxNy). Meanwhile, the buffer layer 111 may be a single layer or a multilayer including the above-noted inorganic insulating material, depending on embodiments. A barrier layer (not shown) may be further positioned on the substrate 100. The barrier layer may be positioned between the substrate 100 and the buffer layer 111. The barrier layer may include an inorganic insulating material such as a silicon nitride (SiNx), a silicon oxide (SiOx), or a silicon oxynitride (SiOxNy). The barrier layer (not shown) may be a single layer or a multilayer including the above-noted inorganic insulating material.

The semiconductor 131 may be positioned on the substrate 100. The semiconductor 131 may include one of amorphous silicon, polycrystalline silicon, and an oxide semiconductor. For example, the semiconductor 131 may include a low temperature polycrystalline silicon (LTPS) or may include an oxide semiconductor material including at least one of zinc (Zn), indium (In), gallium (Ga), tin (Sn), and a mixture thereof. For example, the semiconductor 131 may include an indium-gallium-zinc oxide (IGZO). The semiconductor 131 may include a channel region, a source region, and a drain region distinguished by whether impurities are doped thereto. The source region and the drain region may have conductive characteristics corresponding to conductors.

The gate insulating layer 120 may cover the semiconductor 131 and the substrate 100. The gate insulating layer 120 may include an inorganic insulating material such as a silicon nitride (SiNx), a silicon oxide (SiOx), or a silicon oxynitride (SiOxNy). The gate insulating layer 120 may be a single layer or a multilayer including the above-noted inorganic insulating material.

The gate electrode 124 may be positioned on the gate insulating layer 120. The gate electrode 124 may include a metal such as copper (Cu), molybdenum (Mo), aluminum (Al), silver (Ag), chromium (Cr), tantalum (Ta), and/or titanium (Ti), and/or a metal alloy thereof. The gate electrode 124 may be a single layer or a multilayer. A region of the semiconductor 131 overlapping the gate electrode 124 in a plan view may be a channel region.

The interlayer insulating layer 160 may cover the gate electrode 124 and the gate insulating layer 120. The interlayer insulating layer 160 may include an inorganic insulating material such as a silicon nitride (SiNx), a silicon oxide (SiOx), and/or a silicon oxynitride (SiOxNy). The interlayer insulating layer 160 may be a single layer or a multilayer including the above-noted inorganic insulating material.

The source electrode 173 and the drain electrode 175 may be positioned on the interlayer insulating layer 160. The source electrode 173 and the drain electrode 175 may be respectively connected to the source region and the drain region of the semiconductor 131 by the openings formed in the interlayer insulating layer 160 and the gate insulating layer 120. Hence, the above-described semiconductor 131, the gate electrode 124, the source electrode 173, and the drain electrode 175 may configure one transistor TFT. Depending on embodiments, the transistor TFT may not include the source electrode 173 and the drain electrode 175 but may include the source region and the drain region of the semiconductor 131.

The source electrode 173 and the drain electrode 175 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and/or tantalum (Ta), and/or a metal alloy thereof. The source electrode 173 and the drain electrode 175 may be a single layer or a multilayer. The source electrode 173 and the drain electrode 175 according to another embodiment may be configured to be a triple layer including an upper layer, an intermediate layer, and a lower layer, the upper layer and the lower layer may include titanium (Ti), and the intermediate layer may include aluminum (Al).

The organic film 180 may be positioned on the source electrode 173 and the drain electrode 175. The organic film 180 may cover the source electrode 173, the drain electrode 175, and the interlayer insulating layer 160. The organic film 180 planarizes the surface of the substrate 100 on which transistors TFT are installed, it may be an organic insulator, and it may include at least one material of a polyimide, a polyamide, an acryl resin, benzocyclobutene, and a phenol resin.

The pixel electrode 191 may be positioned on the organic film 180. The pixel electrode 191 may also be referred to as an anode, and it may be a single layer including a transparent conductive oxide film or a metal material, or a multilayer including the same. The transparent conductive oxide film may include an indium tin oxide (ITO), a poly-ITO, an indium zinc oxide (IZO), an indium gallium zinc oxide (IGZO), and/or an indium tin zinc oxide (ITZO). The metal material may include silver (Ag), molybdenum (Mo), copper (Cu), gold (Au), and/or aluminum (Al).

The organic film 180 may include an opening 81 for exposing the source electrode 173. The source electrode 173 and the pixel electrode 191 may be physically and electrically connected to each other through the opening 81 of the organic film 180. Accordingly, the pixel electrode 191 may receive an output current to be transmitted to the emission layer 370 from the source electrode 173.

A pixel defining layer 350 may be positioned on the pixel electrode 191 and the organic film 180. The pixel defining layer 350 may include a pixel opening 351 overlapping at least part of the pixel electrode 191. The pixel opening 351 may overlap a center portion of the pixel electrode 191, and may not overlap an edge of the pixel electrode 191. Therefore, the pixel opening 351 may be smaller than the pixel electrode 191. The pixel defining layer 350 may partition a formation position of the emission layer 370 so that the emission layer 370 may be positioned on a portion in which an upper side of the pixel electrode 191 is exposed. The pixel defining layer 350 may be an organic insulator including at least one material of polyimide, polyamide, acryl resin, benzocyclobutene, and phenol resin, and depending on embodiments, the pixel defining layer 350 may be formed to be a black pixel defining layer (BPDL) including a black pigment.

The emission layer 370 may be positioned in the pixel opening 351 partitioned by the pixel defining layer 350. The emission layer 370 may include organic materials for emitting red, green, and blue light. The emission layer 370 for emitting red, green, and blue light may include a low molecular or polymer organic material. FIG. 6 shows a single-layered emission layer 370, and in actuality, auxiliary layers such as an electron injecting layer, an electron transport layer, a hole transport layer, and a hole injecting layer may be positioned above/below the emission layer 370, and the hole injecting layer and the hole transport layer may be positioned below the emission layer 370, while the electron transport layer and the electron injecting layer may be positioned above the emission layer 370.

The common electrode 270 may be positioned on the pixel defining layer 350 and the emission layer 370. The common electrodes 270 may also be referred to as a cathode, and may be made of a transparent conductive layer including an indium tin oxide (ITO), an indium zinc oxide (IZO), an indium gallium zinc oxide (IGZO), and/or an indium tin zinc oxide (ITZO). The common electrodes 270 may have a semi-transparent characteristic, and it may configure a microcavity with the pixel electrode 191. According to the microcavity structure, light with a specific wavelength may be discharged upward due to the spacing and characteristics between two electrodes, thereby displaying the red, the green, or the blue.

The encapsulation layer 400 may be positioned on the common electrode 270. The encapsulation layer 400 may include at least one inorganic film and at least one organic film. In an embodiment, the encapsulation layer 400 may include a first inorganic encapsulation layer 410, an organic encapsulation layer 420, and a second inorganic encapsulation layer 430. This is, however, an example, and the number of inorganic films and organic films configuring the encapsulation layer 400 is modifiable in many ways. The first inorganic encapsulation layer 410, the organic encapsulation layer 420, and the second inorganic encapsulation layer 430 may be positioned in part of the display area DA and the non-display area PA. Depending on embodiments, the organic encapsulation layer 420 may be formed with respect to the display area (DA), and the first inorganic encapsulation layer 410 and the second inorganic encapsulation layer 430 may be positioned up to the non-display area PA. The encapsulation layer 400 may protect the light emitting diode LED from moisture or oxygen that may be input from the outside, and an end portion of the first inorganic encapsulation layer 410 and the second inorganic encapsulation layer 430 may directly contact each other.

A first insulating layer 501 may be positioned on the encapsulation layer 400. The first insulating layer 501 may be made of an inorganic insulating layer or an organic insulator. The inorganic material included in the inorganic insulating layer may be at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. Depending on embodiments, the first insulating layer 501 may be omitted.

The sensing electrode connector 541, the first sensing insulating layer 510, and the sensing electrodes 520 and 540 may be positioned on the first insulating layer 501. One of the first sensing electrode connector 521 and the second sensing electrode connector 541 may be positioned on the same layer as the sensing electrodes 520 and 540, and the other may be positioned on a layer that is different from that of the sensing electrodes 520 and 540. An example in which the second sensing electrode connector 541 is positioned on the layer that is different from that of the sensing electrodes 520 and 540 will now be described.

The sensing electrode connector 541, the first sensing insulating layer 510, and the sensing electrodes 520 and 540 may configure a detecting sensor. The detecting sensor may be classified into a resistive type, a capacitive type, an electro-magnetic type, and an optical type. The detecting sensor according to an embodiment may use the capacitive sensor.

The sensing electrode connector 541 may be positioned on the first insulating layer 501, and the first sensing insulating layer 510 may be positioned on the first insulating layer 501 and the second sensing electrode connector 541. The first sensing insulating layer 510 may include an inorganic insulating material or an organic insulating material. The inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. The organic insulating material may include at least one of an acryl-based resin, a methacryl-based resin, polyisoprene, a vinyl-based resin, an epoxy-based resin, a urethane-based resin, a cellulose-based resin, and a perylene-based resin.

The sensing electrodes 520 and 540 may be positioned on the first sensing insulating layer 510. The sensing electrodes 520 and 540 may include multiple first sensing electrodes 520 and multiple second sensing electrodes 540. The first sensing electrodes 520 may be electrically insulated from the second sensing electrodes 540. The first sensing insulating layer 510 may include an opening for exposing an upper side of the second sensing electrode connector 541, and the second sensing electrode connector 541 may electrically connect the two second sensing electrodes 540 that are connected to the second sensing electrode 540 and are adjacent to each other through the opening of the first sensing insulating layer 510. As shown in FIG. 5, the first sensing electrode connector 521 for connecting the first sensing electrode 520 may be formed on the same layer as the first sensing electrode 520 and the second sensing electrode 540.

The sensing electrodes 520 and 540 may have conductive materials with excellent conductivity. For example, the sensing electrodes 520 and 540 may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), and/or tantalum (Ta), and/or a metal alloy thereof. The sensing electrodes 520 and 540 may be a single layer or a multilayer. The sensing electrodes 520 and 540 may include openings and may allow the light discharged by the light emitting diode to be discharged upward without interference. Depending on embodiments, the sensing electrodes 520 and 540 may be configured to be a triple layer including an upper layer, an intermediate layer, and a lower layer, and the upper layer and the lower layer may include titanium (Ti) and the intermediate layer may include aluminum (Al).

Depending on embodiments, a thickness t41 of the sensing electrode connector 541 may be less than a thickness t40 of the sensing electrode 540. The sensing electrode 540 may be thicker than the sensing electrode connector 541. For example, the thickness t41 of the sensing electrode connector 541 may be equal to or less than about 0.75 times the thickness t40 of the sensing electrode 540.

A second sensing insulating layer 550 may be positioned on the sensing electrodes 520 and 540 and the first sensing insulating layer 510.

The second sensing insulating layer 550 may include an inorganic insulating material or an organic insulating material. The inorganic insulating material may include at least one of a silicon nitride, an aluminum nitride, a zirconium nitride, a titanium nitride, a hafnium nitride, a tantalum nitride, a silicon oxide, an aluminum oxide, a titanium oxide, a tin oxide, a cerium oxide, and a silicon oxynitride. The organic insulating material may include at least one of an acryl-based resin, a methacryl-based resin, polyisoprene, a vinyl-based resin, an epoxy-based resin, a urethane-based resin, a cellulose-based resin, and a perylene-based resin.

The second sensing insulating layer 550 may have a relatively greater refractive index than the adhesive layer 560 to be described. For example, the second sensing insulating layer 550 may have the refractive index of about 1.40 to about 1.59.

The second sensing insulating layer 550 may include a first region 551 overlapping the sensing electrode portion TSP and a second region 552 overlapping the pixel opening 351. The first region 551 and the second region 552 may be spaced from each other, as shown in FIG. 8. The first region 551 and the second region 552 may include a same material and may be formed according to a same process.

The first region 551 may particularly cover the sensing electrodes 520 and 540 from among the sensing electrode portion TSP. The first region 551 may cover upper sides and lateral sides of the sensing electrodes 520 and 540. The first region 551 may contact the sensing electrodes 520 and 540. As shown in FIG. 8, the first region 551 may have a rhombus shape that is the same as or is similar to the sensing electrodes 520 and 540.

The second region 552 may overlap the pixel opening 351, and may overlap the emission layer 370. The second region 552 may have a similar shape to the emission layer 370. According to the second region 552, light discharged in the lateral direction from the emission layer 370 may be refracted in a front direction.

Referring to FIG. 6 and FIG. 7, the thickness t1 of the second sensing insulating layer 550 may be about 1.5 micrometers to about 3.5 micrometers. An end of the second sensing insulating layer 550 may have a tapered shape in a cross-sectional view. A first angle (Θ) of the lateral side of the second sensing insulating layer 550 with respect to the upper side of the first sensing insulating layer 510 may be about 30 degrees to about 60 degrees. A distance L1 between ends of the second region 552 may be greater than a distance L2 between ends of the pixel opening 351. In this instance, a distance d1 between an end of an upper side of the second region 552 and an end of a bottom surface of the emission layer 370 may be equal to or less than about 1.5 micrometers.

A width d2 of the tapered region of the second sensing insulating layer 550 may be equal to or less than about 0.5 micrometers. A distance between ends of the adjacent first region 551 and the second region 552 may be equal to or greater than about 3 micrometers. A distance d3 between the end of an upper side of the first region 551 and the end of the upper side of the second region 552 may be about 4 micrometers.

A distance d4 between the end of the upper side of the sensing electrode 540 and the end of the upper side of the first region 551 may be equal to or greater than about 2.5 micrometers, for example, equal to or greater than about 1.5 micrometers.

Referring to FIG. 6, an adhesive layer 560 may be positioned on the second sensing insulating layer 550. The adhesive layer 560 may combine a polarization layer 600 to be described and the second sensing insulating layer 550.

The adhesive layer 560 may be a pressure sensitive adhesive (PSA). The adhesive layer 560 may include at least one of a polyurethane-based material, a polyacryl-based material, a polyester-based material, a polyepoxy-based material, and a polyvinyl acetate-based material.

The adhesive layer 560 may cover the upper side and the lateral side of the second sensing insulating layer 550. The adhesive layer 560 may cover the upper side of the first sensing insulating layer 510 exposed by the second sensing insulating layer 550.

The refractive index of the adhesive layer 560 may be less than the refractive index of the second sensing insulating layer 550. The difference between the refractive index of the second sensing insulating layer 550 and the refractive index of the adhesive layer 560 may be equal to or greater than about 0.05. The second sensing insulating layer 550 and the adhesive layer 560 may have any refractive indexes that satisfy the refractive index difference, for example, the refractive index of the second sensing insulating layer 550 may be about 1.40 to about 1.59.

The polarization layer 600 may be positioned on the adhesive layer 560. The polarization layer 600 may reduce reflectance of light (e.g., external light) that is input toward the display device from the outside, and/or may increase color purity of light emitted by the display device. The polarization layer 600 may be a film type, and may be combined to the elements stacked through the adhesive layer 560. The film-type polarization layer 600 may be an example and may include a stretchable synthetic resin film.

According to an embodiment, the display device robust in high temperature and high moisture may be provided through the first region 551 of the second sensing insulating layer 550 covering the sensing electrodes 520 and 540. Efficiency of light output to the front through the second region 552 overlapping the emission layer 370 and the adhesive layer 560 covering the same may be increased. Further, the process for forming the layer for covering the second sensing insulating layer 550 can be simplified by using the adhesive layer 560 for adhering the polarization layer 600.

A form of the second sensing insulating layer of the display device according to an embodiment will now be described with reference to FIG. 9 to FIG. 12. FIG. 9, FIG. 10, FIG. 11, and FIG. 12 are schematic top plan views of a second sensing insulating layer in a display device according to an embodiment. No same elements as the above-noted elements will be described.

Figure 9:
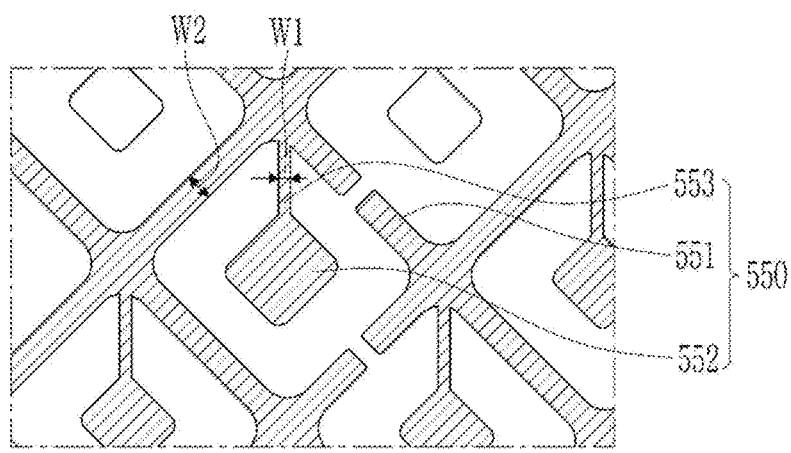

Referring to FIG. 9 with the above-noted drawings, the second sensing insulating layer 550 may include a first region 551 overlapping the sensing electrodes 520 and 540, a second region 552 overlapping the pixel opening 351, and a connector 553 for connecting the first region 551 and the second region 552.

The connector 553 may have any type of shape, and may extend from a corner of the first region 551 and may be connected to a corner of the second region 552.

Figure 10:
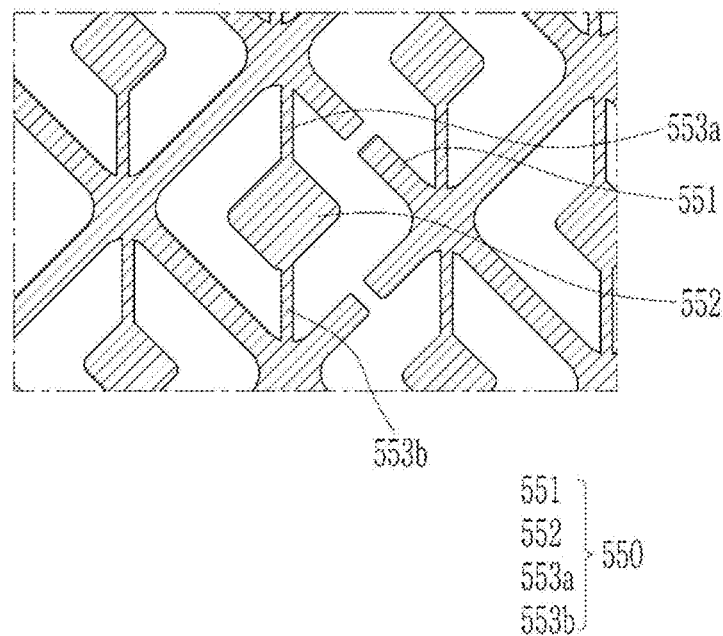
Figure 11:
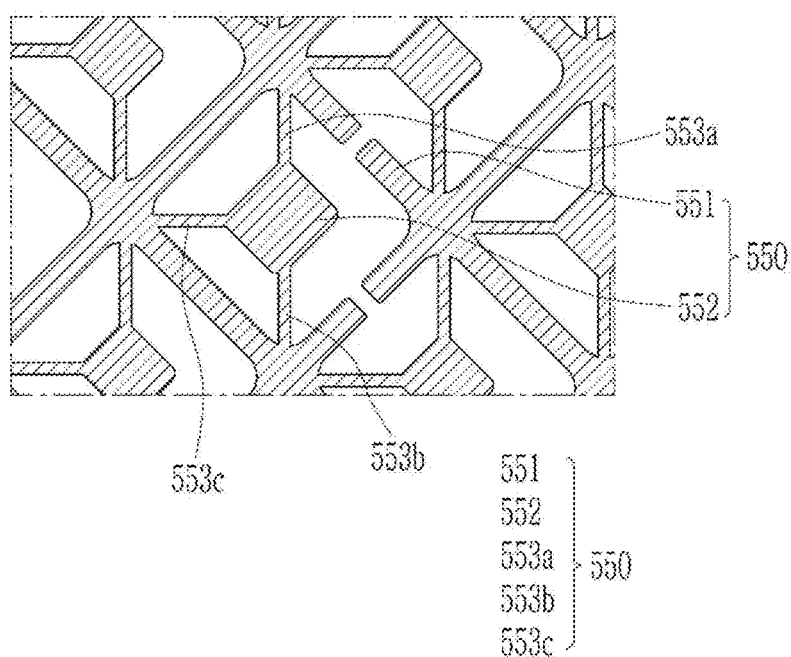
Figure 12:
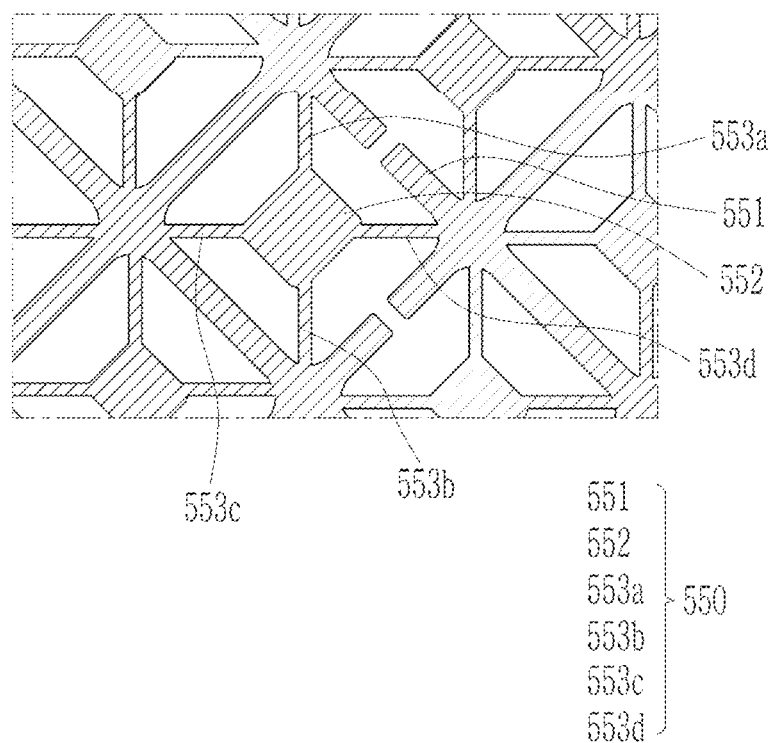

The second sensing insulating layer 550 may include at least one connector 553. The second sensing insulating layer 550 may include one connector 553 as shown in FIG. 9, it may include two connectors 553a and 553b arranged in one direction as shown in FIG. 10, it may include three connectors 553a, 553b, and 553c as shown in FIG. 11, or it may include four connectors 553a, 553b, 553c, and 553d as shown in FIG. 12. However, the disclosure is not limited to the above-noted number and connection, and the number and the connection types of the connector included by the second sensing insulating layer 550 are modifiable in many ways.

The width W1 of the connector 553 according to an embodiment may be equal to or less than about one half of the width W2 of the first region 551. The width W2 of the first region 551 in a plan view may be equal to or greater than about 6 micrometers, and the width W1 of the connector 553 in a plan view may be equal to or greater than about 3 micrometers.

In case that the connector for connecting the first region and the second region is included in a like way of the second sensing insulating layer according to an embodiment, part of the pattern may be prevented from being torn out during a process for patterning the second sensing insulating layer, thereby providing the reliability-improved display device.

Figure 13:
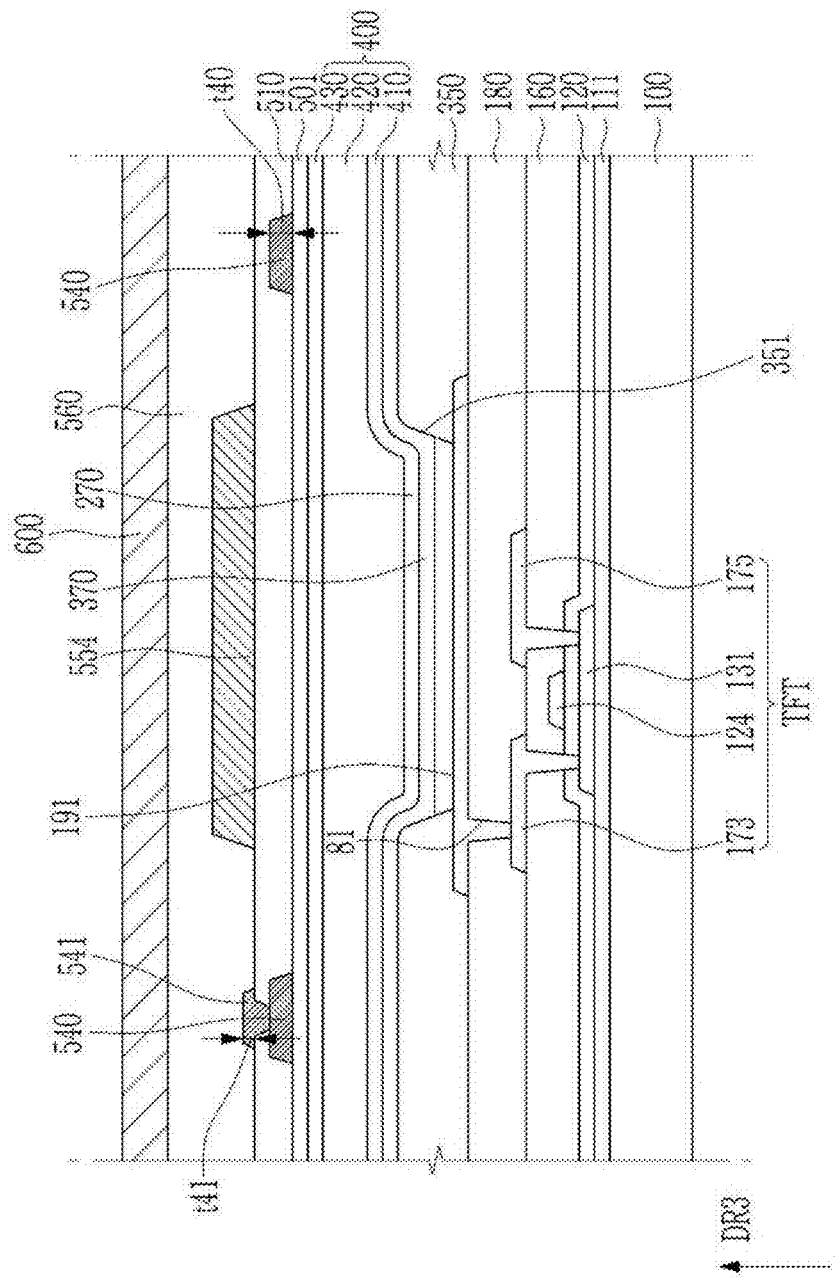
FIG. 13 is a schematic cross-sectional view of part of a display area in a display device according to an embodiment.

The display device according to an embodiment will now be described with reference to FIG. 13. FIG. 13 is a schematic cross-sectional view of part of a display area in a display device according to an embodiment. Descriptions of elements that are the same as or similar to elements already described will be omitted.

Referring to FIG. 13, a sensing electrode portion TSP may be positioned on the first insulating layer 501. The sensing electrode portion TSP may include the sensing electrodes 520 and 540 and the sensing electrode connector 541. The sensing electrode 540 according to an embodiment may be positioned on the first insulating layer 501. The sensing electrode connector 541 may be positioned on the first sensing insulating layer 510. Differing from an embodiment described with reference to FIG. 6, the sensing electrode 540 may be positioned below the sensing electrode connector 541.

The thickness t41 of the sensing electrode connector 541 may be less than the thickness t40 of the sensing electrode 540 according to an embodiment. The sensing electrode 540 may be thicker than the sensing electrode connector 541. For example, the thickness t41 of the sensing electrode connector 541 may be equal to or less than about 0.75 times the thickness t40 of the sensing electrode 540, and a first sensing insulating layer 510 may be positioned between the sensing electrode 540 and the sensing electrode connector 541. The first sensing insulating layer 510 may include an organic insulating material. The organic insulating material may include at least one of an acryl-based resin, a methacryl-based resin, polyisoprene, a vinyl-based resin, an epoxy-based resin, a urethane-based resin, a cellulose-based resin, and a perylene-based resin.

The first sensing insulating layer 510 may provide a planar upper side. In case that the first sensing insulating layer including an inorganic insulating material is positioned on the relatively thick sensing electrode 540, a short circuit may be generated between the sensing electrode 540 and the sensing electrode connector 541. According to an embodiment, in case that the relatively thick sensing electrode 540 is disposed on the lower side of the sensing electrode connector 541, the first sensing insulating layer 510 including an organic insulating material may be provided. The first sensing insulating layer 510 may be planar and may have a predetermined or selected thickness so that the sensing electrode 540 and the sensing electrode connector 541 may be stably formed.

A second sensing insulating layer 554 may be positioned on the first sensing insulating layer 510 overlapping the emission layer 370. The second sensing insulating layer 554 may overlap the emission layer 370 exposed by the pixel opening 351. The second sensing insulating layer 554 may have an island shape overlapping the emission layer 370. It may be spaced from the second sensing insulating layer 554 overlapping the other adjacent emission layer 370. The second sensing insulating layer 554 may have the same or similar shape as/to the respective emission layers 370.

The second sensing insulating layer 554 may be positioned between the adjacent sensing electrodes 540. The second sensing insulating layer 554 may not overlap the sensing electrode 540 and the sensing electrode connector 541. The second sensing insulating layer 554 may be spaced from the sensing electrode 540 and the sensing electrode connector 541. The second sensing insulating layer 554 may expose the sensing electrode connector 541.

An adhesive layer 560 may be positioned on the second sensing insulating layer 554. The adhesive layer 560 may be a pressure sensitive adhesive (PSA). The adhesive layer 560 may include at least one of a polyurethane-based material, a polyacryl-based material, a polyester-based material, a polyepoxy-based material, and a polyvinyl acetate-based material.

The adhesive layer 560 may be positioned on the second sensing insulating layer 554, the sensing electrode connector 541, and the first sensing insulating layer 510. The adhesive layer 560 may cover the upper side and the lateral side of the second sensing insulating layer 554. The adhesive layer 560 may cover the upper side and the lateral side of the exposed sensing electrode connector 541. The adhesive layer 560 may contact the upper side of the first sensing insulating layer 510 not covered by the sensing electrode connector 541 and the second sensing insulating layer 554.

The refractive index of the adhesive layer 560 may be less than the refractive index of the second sensing insulating layer 554. The difference between the refractive index of the second sensing insulating layer 550 and the refractive index of the adhesive layer 560 may be equal to or greater than about 0.05. The second sensing insulating layer 550 and the adhesive layer 560 may have any refractive indexes that satisfy the refractive index difference, and for example, the refractive index of the second sensing insulating layer 550 may be about 1.40 to about 1.59.

The polarization layer 600 may be positioned on the adhesive layer 560. The polarization layer 600 may reduce reflectance of light (e.g., external light) that is input toward the display device from the outside, and/or may increase color purity of light emitted by the display device.

The polarization layer 600 may be a film type, and may be combined to the elements stacked through the adhesive layer 560. The film-type polarization layer 600 may be an example and may include a stretchable synthetic resin film.

According to an embodiment, the efficiency of light output to the front through the second sensing insulating layer 554 overlapping the emission layer 370 may be increased. Further, the process for forming the layer for covering the second sensing insulating layer 554 may be simplified by using the adhesive layer 560 for adhering the polarization layer 600. Further, the small sensing electrode connector 541 may be positioned higher than the sensing electrode 540 is, so in case that the sensing electrode connector 541 is exposed, reliability of the display device may be maintained.

Figure 14:
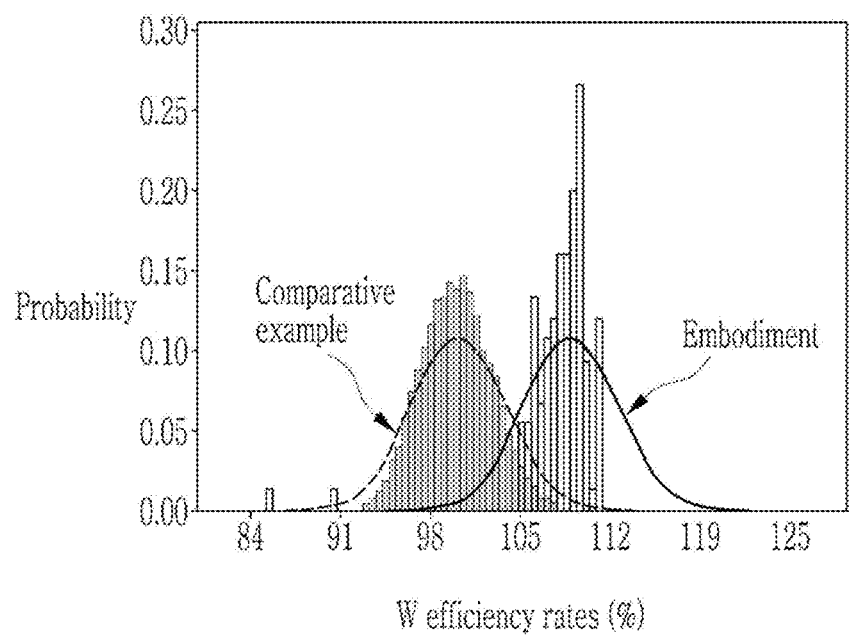
FIG. 14 is a schematic graph of light extracting effects according to a comparative example and an embodiment.
Figure 15:
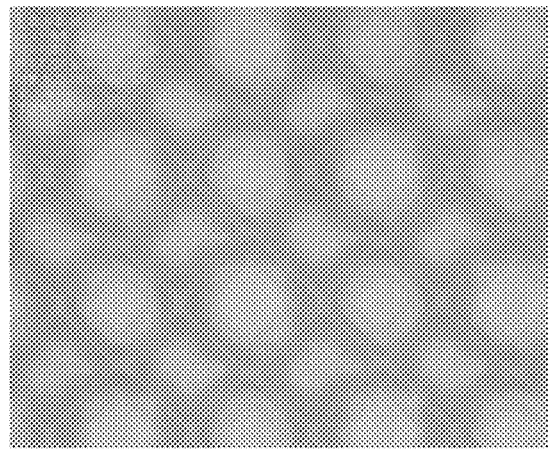
FIG. 15 is a schematic image of part of a display area in a display device according to an embodiment.
Figure 16:
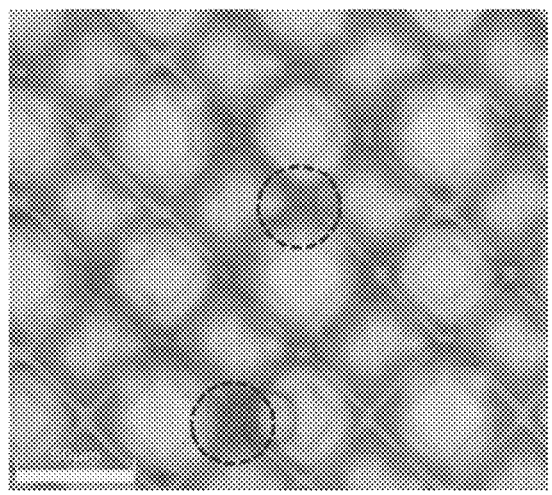
FIG. 16 is a schematic image of part of a display area in a display device according to a comparative example.

A display device according to a comparative example and an embodiment will now be described with reference to FIG. 14 to FIG. 16. FIG. 14 is a schematic graph of light extracting effects according to a comparative example and an embodiment. FIG. 15 is a schematic image of part of a display area in a display device according to an embodiment. FIG. 16 is a schematic image of part of a display area in a display device according to a comparative example.

Referring to FIG. 14, an embodiment to which the second sensing insulating layer including a first region and a second region is applied may have an average light-outputting efficiency of about 108.8% compared to the comparative example to which the second sensing insulating layer may not be applied. It is found that an embodiment shows the light-outputting efficiency that may be increased by 8.8% relative to the comparative example.

Referring to FIG. 15, it is found in an embodiment to which the second sensing insulating layer including a first region and a second region is applied that the sensing electrode portion may be robust in the high temperature and high moisture condition.

On the contrary, referring to FIG. 16, it is found in the comparative example to which the second sensing insulating layer including no second region is applied that the sensing electrode portion, particularly the sensing electrode connector may be corroded in the high temperature and high moisture condition.

According to embodiments, the efficiency of light output to the front through the second sensing insulating layer overlapping the pixel opening may be increased, and reliability of the display device may be maintained in the high temperature and high moisture condition through the second sensing insulating layer covering the sensing electrode. As the adhesive layer and the polarization layer are provided on the second sensing insulating layer, the light-outputting efficiency may be increased through the refraction of light according to a refractive index difference between the second sensing insulating layer and the adhesive layer without an additional process, thereby simplifying the process and reducing the time and cost used for the process.

While this disclosure has been described in connection with what is considered to be practical embodiments, it is to be understood that the invention is not limited to the disclosed embodiments, but, on the contrary, is intended to cover various modifications and equivalent arrangements included within the spirit and scope of the disclosure.

What is claimed is:

1. A display device comprising:
   a pixel electrode disposed on a substrate;
   a pixel defining layer disposed on the pixel electrode and including a pixel opening overlapping the pixel electrode;

an encapsulation layer disposed on the pixel defining layer;
a sensing electrode portion disposed on the encapsulation layer;
a sensing insulating layer overlapping at least part of the sensing electrode portion; and
an adhesive layer disposed on the sensing insulating layer, wherein
the sensing insulating layer includes:
a first region overlapping the sensing electrode portion, and
a second region overlapping the pixel opening,
a portion of the adhesive layer spaces the first region apart from the second region, and
a refractive index of the adhesive layer is less than a refractive index of the sensing insulating layer.

2. The display device of claim 1, wherein
the display device further includes:
a first insulating layer disposed on the encapsulation layer; and
a first sensing insulating layer disposed on the first insulating layer,
the sensing insulating layer is a second sensing insulating layer, and
the sensing electrode portion includes
a sensing electrode connector disposed between the first insulating layer and the first sensing insulating layer, and
a sensing electrode disposed on the first sensing insulating layer.

3. The display device of claim 2, wherein
the adhesive layer physically contacts part of the first sensing insulating layer.

4. The display device of claim 3, wherein
the display device further includes a polarization layer disposed on the adhesive layer.

5. The display device of claim 2, wherein
the second sensing insulating layer further includes at least one connector physically connecting the first region and the second region.

6. The display device of claim 5, wherein
a width of the connector is equal to or less than about one half of a width of the first region.

7. The display device of claim 2, wherein
the second sensing insulating layer is disposed on the sensing electrode and the first sensing insulating layer,
the first region overlaps the sensing electrode,
the first region is disposed on the sensing electrode, and
a shape of the first region in a plan view corresponds to a shape of the sensing electrode in a plan view.

8. The display device of claim 2, wherein p1 a thickness of the sensing electrode connector is less than a thickness of the sensing electrode.

9. The display device of claim 2, wherein
a refractive index of the second sensing insulating layer is about 1.40 to about 1.59.

10. The display device of claim 1, wherein
the first region at least partially surrounds the second region in a view in a direction perpendicular to the substrate.

11. A display device comprising:
a pixel electrode disposed on a substrate;
a pixel defining layer disposed on the pixel electrode and including a pixel opening overlapping the pixel electrode;
an encapsulation layer disposed on the pixel defining layer;
a sensing electrode disposed on the encapsulation layer;
a first sensing insulating layer disposed on the sensing electrode;
a sensing electrode connector disposed on the first sensing insulating layer;
a second sensing insulating layer disposed on the first sensing insulating layer; and
an adhesive layer disposed on the second sensing insulating layer, wherein
the second sensing insulating layer overlaps the pixel opening, and
a refractive index of the adhesive layer is less than a refractive index of the second sensing insulating layer.

12. The display device of claim 11, wherein
the first sensing insulating layer includes an organic insulating material.

13. The display device of claim 11, wherein
a width between ends of the second sensing insulating layer is greater than a width between ends of the opening, and
the second sensing insulating layer has an island shape.

14. The display device of claim 11, wherein
the adhesive layer overlaps the first sensing insulating layer, the second sensing insulating layer, and an upper side of the sensing electrode connector.

15. The display device of claim 11, wherein
a thickness of the sensing electrode connector is less than a thickness of the sensing electrode.

16. The display device of claim 11, wherein
the second sensing insulating layer exposes the sensing electrode connector.

17. The display device of claim 11, wherein
a thickness of the second sensing insulating layer is about 1.5 micrometers to about 3.5 micrometers.

18. The display device of claim 11, wherein
a refractive index difference between the second sensing insulating layer and the adhesive layer is equal to or greater than about 0.05.

19. The display device of claim 11, wherein
the display device further includes a polarization layer disposed on the adhesive layer.

20. A display device comprising:
a pixel electrode disposed on a substrate;
a pixel defining layer disposed on the pixel electrode and including a pixel opening overlapping the pixel electrode;
an encapsulation layer disposed on the pixel defining layer:
a sensing electrode portion disposed on the encapsulation layer:
a sensing insulating layer overlapping at least part of the sensing electrode portion; and
an adhesive layer disposed on the sensing insulating layer, wherein
the sensing insulating layer includes:
a first region overlapping the sensing electrode portion, and
a second region overlapping the pixel opening
a refractive index of the adhesive layer is less than a refractive index of the sensing insulating layer, and
a width between ends of the second region is greater than a width between ends of the opening.

* * * * *